(12) United States Patent
Obana et al.

(10) Patent No.: US 8,941,378 B2
(45) Date of Patent: Jan. 27, 2015

(54) MAGNETIC SENSOR

(71) Applicant: Alps Electric Co., Ltd., Ota-ku, Tokyo (JP)

(72) Inventors: Masayuki Obana, Tokyo (JP); Shinji Sugihara, Tokyo (JP); Hideto Ando, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 220 days.

(21) Appl. No.: 13/708,243

(22) Filed: Dec. 7, 2012

(65) Prior Publication Data

US 2013/0241545 A1 Sep. 19, 2013

(30) Foreign Application Priority Data

Mar. 14, 2012 (JP) ................. 2012-057222

(51) Int. Cl.
*G01R 33/02* (2006.01)
*G01R 33/18* (2006.01)
*G01R 33/00* (2006.01)
*G01R 33/09* (2006.01)
*G01B 7/14* (2006.01)
*G01B 7/30* (2006.01)
*G01R 33/06* (2006.01)
*H01L 43/08* (2006.01)

(52) U.S. Cl.
CPC ............... *G01R 33/18* (2013.01); *G01R 33/02* (2013.01); *G01R 33/0017* (2013.01); *G01R 33/093* (2013.01); *G01R 33/096* (2013.01)
USPC ..................................... 324/252; 324/207.21

(58) Field of Classification Search
CPC .. G01R 33/093; G01R 33/0017; G01R 33/18; G01R 33/02; G01R 33/0206; G01R 33/096

USPC ........ 324/51, 55, 200, 207.2, 207.18, 207.19, 324/207.21, 207.23, 219, 227, 228, 244, 324/252

See application file for complete search history.

(56) References Cited

U.S. PATENT DOCUMENTS

2006/0082933 A1* 4/2006 Kishi et al. ............... 360/324.11
2009/0284254 A1* 11/2009 Kasajima ................. 324/207.21
2010/0259257 A1* 10/2010 Sasaki et al. .................. 324/252

FOREIGN PATENT DOCUMENTS

WO WO 2011-068146 6/2011

* cited by examiner

*Primary Examiner* — Jermele M Hollington
*Assistant Examiner* — Raul Rios Russo
(74) *Attorney, Agent, or Firm* — Hunton & Williams LLP

(57) ABSTRACT

A magnetic sensor includes a plurality of magnetoresistive elements that are formed by stacking a magnetic layer and a non-magnetic layer on a substrate and that exhibit a magnetoresistive effect and a soft magnetic member that converts a vertical magnetic field component into a horizontal magnetic field component. The soft magnetic member is formed of a plurality of first and second soft magnetic portions respectively extending in an X1-X2 direction and a Y1-Y2 direction, combined together in the shape of a lattice. The magnetoresistive elements have a sensitivity direction in the Y2 direction and include a magnetoresistive element located on a Y1 side portion side of the first soft magnetic portion and a magnetoresistive element located on a Y2 side portion side of the first soft magnetic portion, respectively receiving horizontal magnetic field components from the Y1 direction and Y2 direction.

4 Claims, 8 Drawing Sheets

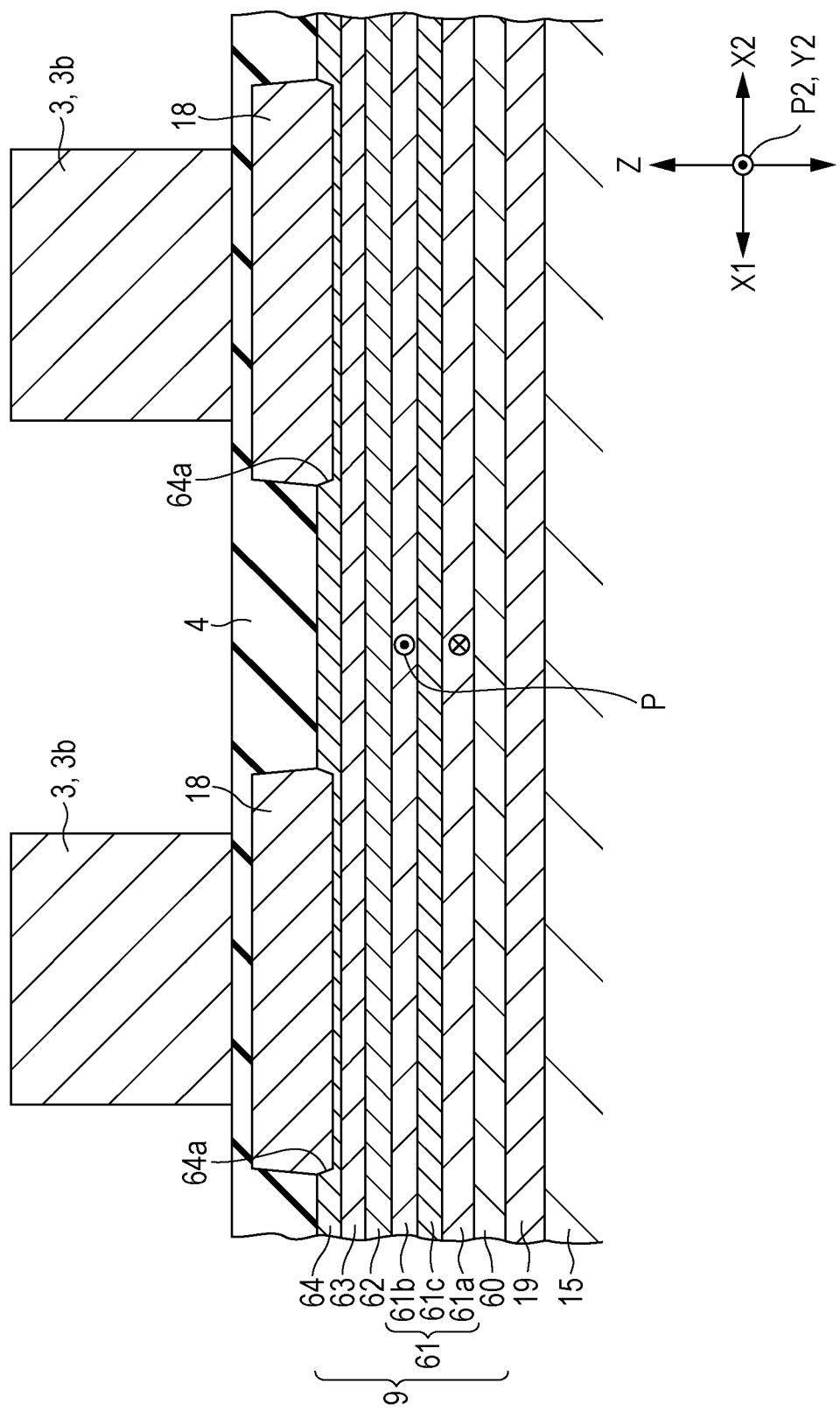

MAGNETIC SENSOR

This application contains subject matter related to and claims benefit of Japanese Patent Application No. 2012-057222 filed on Mar. 14, 2012, the entire contents of which is incorporated herein by reference.

BACKGROUND OF THE DISCLOSURE

1. Field of the Disclosure

The present disclosure relates to magnetic sensors that use a magnetoresistive element and that can detect a vertical magnetic field component.

2. Description of the Related Art

Magnetic sensors using a magnetoresistive element can be used as geomagnetic sensors that detect the earth's magnetic field and are built into mobile apparatuses, such as cellular phones.

A geomagnetic sensor is configured to be capable of detecting magnetic field components in the X-axis and Y-axis directions orthogonal to each other in a horizontal plane and in the vertical direction (Z-axis direction) orthogonal to the horizontal plane.

International Publication No. WO2011/068146 discloses a magnetic sensor that uses a magnetoresistive element and that can detect a vertical magnetic field component. In International Publication No. WO2011/068146, a vertical magnetic field component is converted into a horizontal magnetic field component using a soft magnetic material, and the soft magnetic material and a magnetoresistive element are arranged such that the converted horizontal magnetic field component can be input into the magnetoresistive element.

A magnetic sensor, which is built into, for example, a cellular phone as described above, receives a disturbance magnetic field from a loud speaker or the like.

At this time, when the disturbance magnetic field acts from the sensitivity axis direction of a magnetoresistive element and the vertical magnetic field component of the earth's magnetic field is input at the same time, the disturbance magnetic field is superimposed on the horizontal magnetic field component (the earth's magnetic field) which has been converted by the soft magnetic material, that is, the horizontal magnetic field component is biased and, hence, the sensitivity of the magnetoresistive element changes from that in a state in which no disturbance magnetic field is generated, whereby the earth's magnetic field cannot be detected with high accuracy.

These and other drawbacks exist.

SUMMARY OF THE DISCLOSURE

Embodiments of the present disclosure solve the problem described above. Specifically, the present disclosure provides a magnetic sensor that can provide shielding against a disturbance magnetic field in the direction of a horizontal plane and that can reduce a change in the sensitivity of the magnetoresistive element between the case in which the disturbance magnetic field exists and the case in which the disturbance magnetic field does not exist.

A magnetic sensor according to the present disclosure includes: a magnetoresistive element that is formed by stacking a magnetic layer and a non-magnetic layer on a substrate and that exhibits a magnetoresistive effect; and a soft magnetic member that converts a vertical magnetic field component input from the outside from a direction perpendicular to the substrate into a horizontal magnetic field component in a direction along the substrate and that provides the horizontal magnetic field component to the magnetoresistive element. The soft magnetic member is arranged with a space in a height direction between the soft magnetic member and the magnetoresistive element. The magnetoresistive element is formed in such a manner as to extend in an X1-X2 direction and has a sensitivity axis in a Y1-Y2 direction, where the X1-X2 direction and the Y1-Y2 direction are orthogonal to each other in a plane along the substrate. The soft magnetic member is formed of a first soft magnetic portion extending in the X1-X2 direction and a second soft magnetic portion extending in the Y1-Y2 direction combined together. The magnetoresistive element is arranged in a location in which the magnetoresistive element is capable of receiving the horizontal magnetic field component in the Y1-Y2 direction from the first soft magnetic portion.

In the present disclosure, shielding against a disturbance magnetic field from the X1-X2 direction is provided by the first soft magnetic portion, and shielding against a disturbance magnetic field from the Y1-Y2 direction, which is the sensitivity direction of the magnetoresistive element, is provided by the second soft magnetic portion. Hence, compared with the related art, a change in the sensitivity of the magnetoresistive element between the case in which a disturbance magnetic field exists and the case in which a disturbance magnetic field does not exist can be reduced, whereby a vertical magnetic field component can be detected with high accuracy.

In the present disclosure, the magnetoresistive element includes a current bypass electrode layer arranged thereon in a location facing, in the height direction, the second soft magnetic portion or in a location facing, in the height direction, an intersection portion of the first soft magnetic portion and the second soft magnetic portion. Hence, in a portion of the magnetoresistive element where the electrode layer is formed, the sensitivity of the magnetoresistive element can be made to be zero. As a result, by arranging the electrode layer in a location facing, in the height direction, the second soft magnetic portion or in a location facing, in the height direction, an intersection portion of the first soft magnetic portion and the second soft magnetic portion, a change in the sensitivity of the magnetoresistive element between the case in which a disturbance magnetic field from the Y1-Y2 direction exists and the case in which a disturbance magnetic field from the Y1-Y2 direction does not exist can be more effectively reduced.

Embodiments of the present disclosure may be configured as follows. The first soft magnetic portion is one of a plurality of first soft magnetic portions extending in the X1-X2 direction and spaced apart from one another in the Y1-Y2 direction. The second soft magnetic portion is one of a plurality of second soft magnetic portions extending in the Y1-Y2 direction and spaced apart from one another in the X1-X2 direction. The soft magnetic member is formed of the plurality of the first soft magnetic portions and the plurality of the second soft magnetic portions, combined together. The magnetoresistive element includes a first magnetoresistive element that is located on a Y1 side portion side of the first soft magnetic portion and receives the horizontal magnetic field component in the Y1 direction and a second magnetoresistive element that is located on a Y2 side portion side of the first soft magnetic portion and receives the horizontal magnetic field component in the Y2 direction, when viewed in plan from the vertical direction.

In the present disclosure, the first magnetoresistive element, the second magnetoresistive element, a third magnetoresistive element have the same configuration as the second magnetoresistive element, and a fourth magnetoresistive element having the same configuration as the first magnetoresistive element be provided, thereby forming a bridge circuit.

BRIEF DESCRIPTION OF THE DRAWINGS

FIG. 4 is a magnified partial vertical cross-sectional view of the Z-axis magnetic sensor taken along line IV-IV illustrated in FIG. 1, viewed in the direction of the arrows in the figure;

DETAILED DESCRIPTION OF THE DISCLOSURE

The following description is intended to convey a thorough understanding of the embodiments described by providing a number of specific embodiments and details involving a magnetic sensor. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
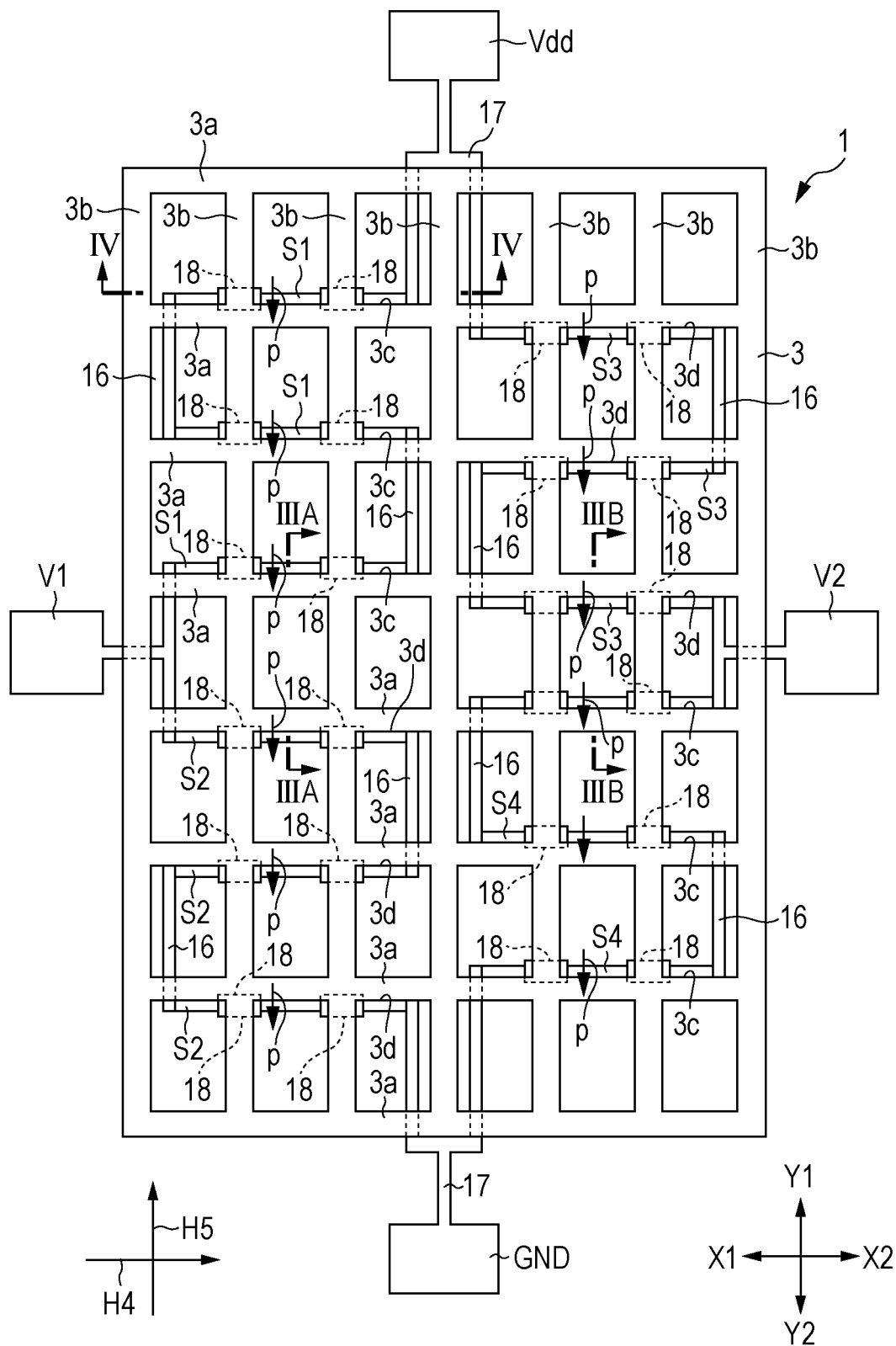
FIG. 1 is a plan view of a Z-axis magnetic sensor according to an exemplary embodiment.
Figure 2:
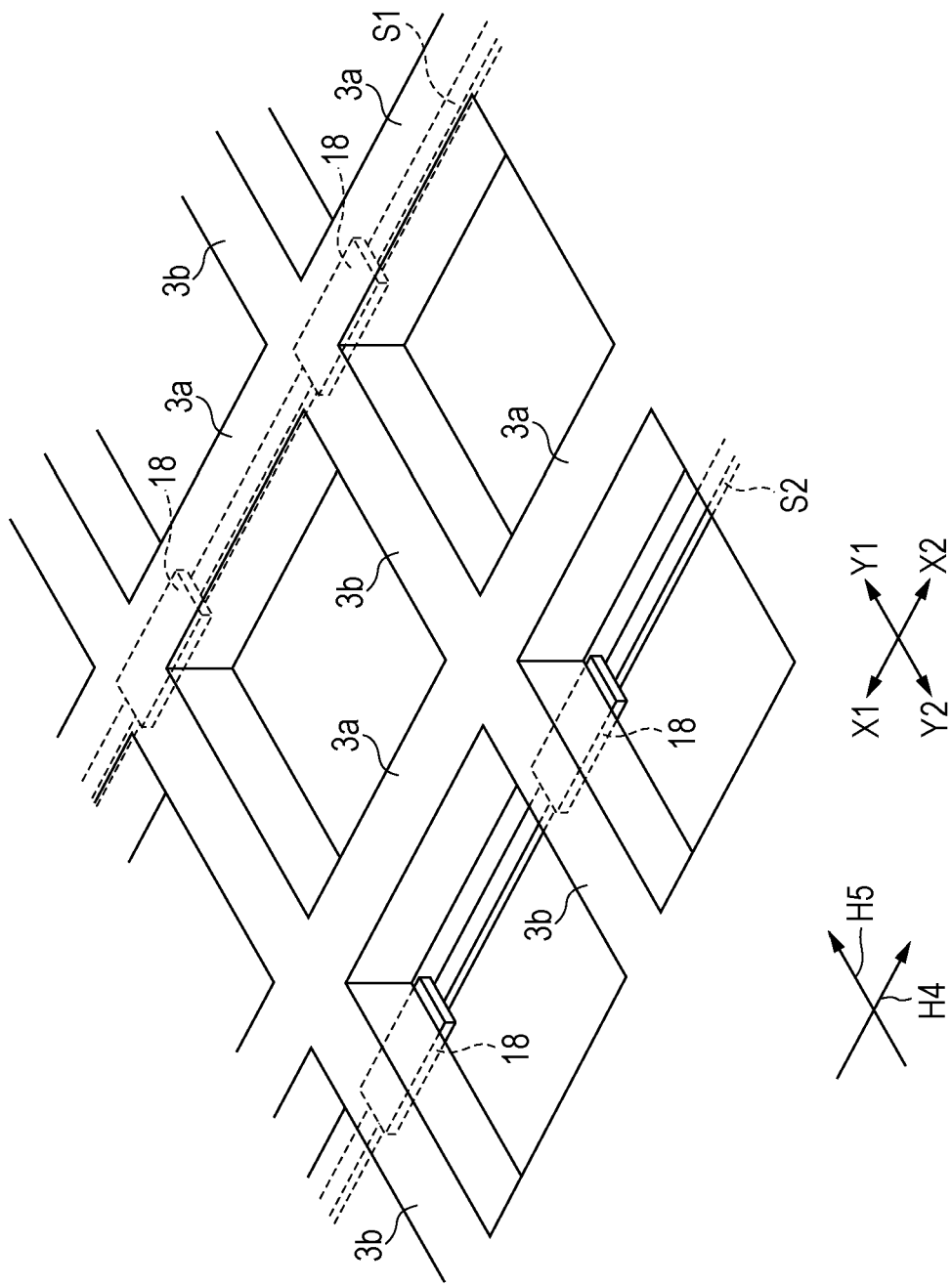
FIG. 2 is a partial perspective view of the Z-axis magnetic sensor illustrated in FIG. 1.
Figure 3A:
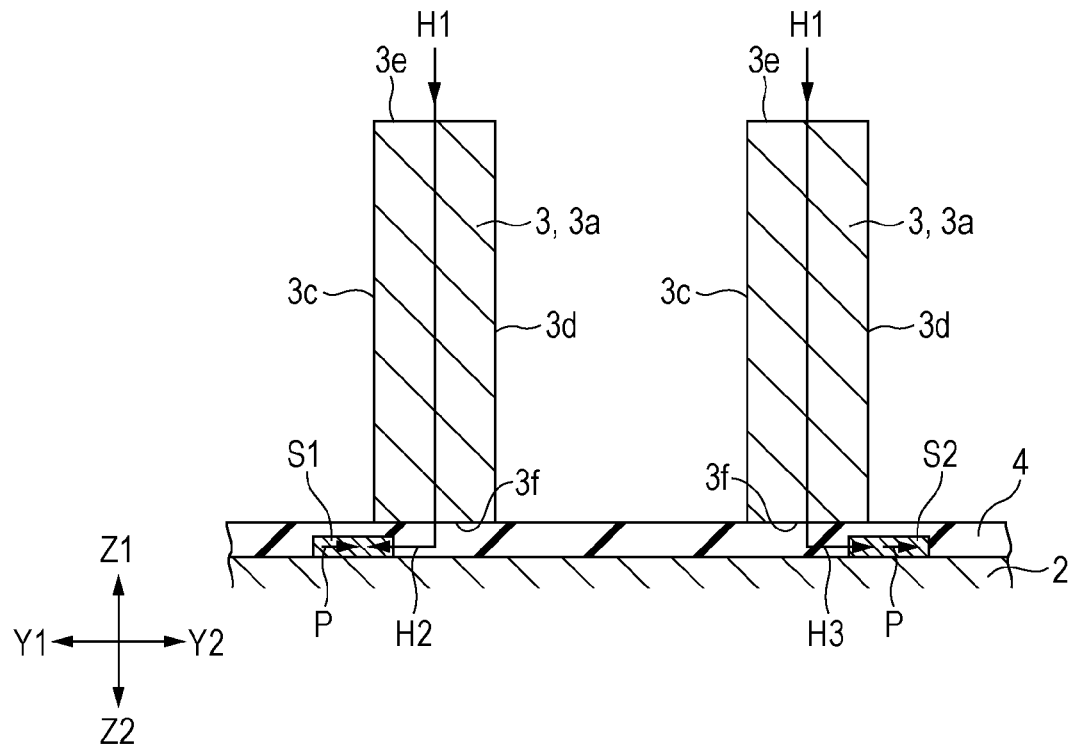
FIG. 3A is a magnified partial vertical cross-sectional view of the Z-axis magnetic sensor taken along line IIIA-IIIA illustrated in FIG. 1, viewed in the direction of the arrows in the figure.
Figure 3B:
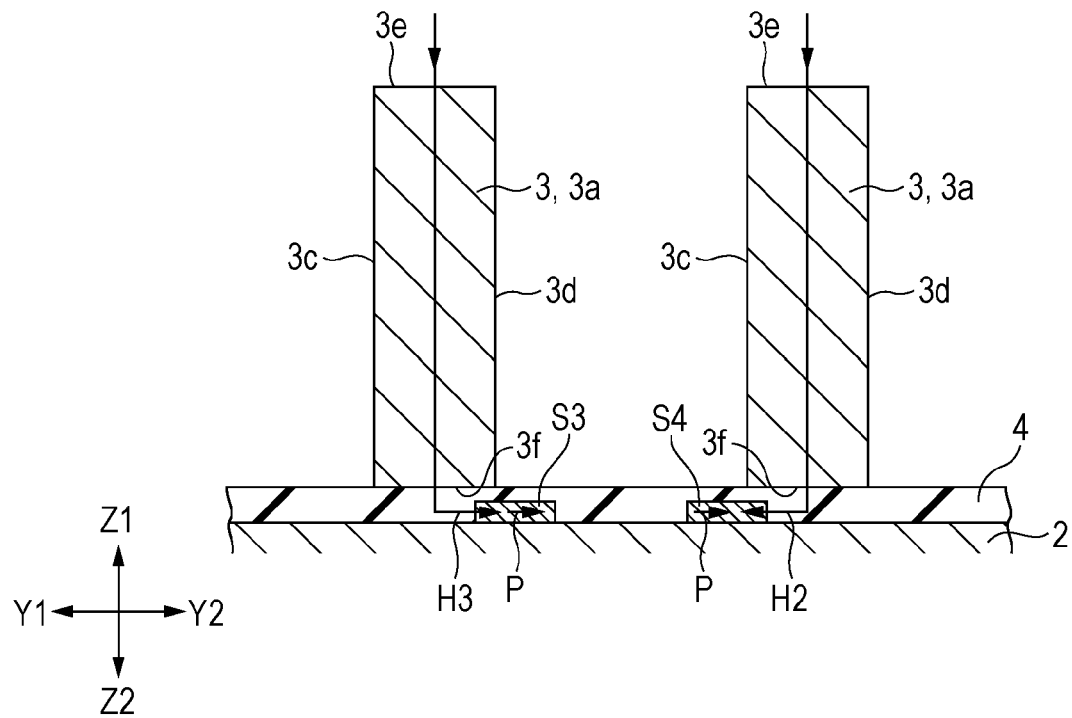
FIG. 3B is a magnified partial vertical cross-sectional view of the Z-axis magnetic sensor taken along line IIIB-IIIB illustrated in FIG. 1, viewed in the direction of the arrows in the figure.

FIG. 1 is a plan view of a Z-axis magnetic sensor according to an exemplary embodiment and FIG. 2 is a partial perspective view of the Z-axis magnetic sensor illustrated in FIG. 1. FIG. 3A is a magnified partial vertical cross-sectional view of the Z-axis magnetic sensor taken along line IIIA-IIIA illustrated in FIG. 1, viewed in the direction of the arrows in the figure, and FIG. 3B is a magnified partial vertical cross-sectional view of the Z-axis magnetic sensor taken along line IIIB-IIIB illustrated in FIG. 1, viewed in the direction of the arrows in the figure. FIG. 4 is a magnified partial vertical cross-sectional view of the Z-axis magnetic sensor taken along line IV-IV illustrated in FIG. 1, viewed in the direction of the arrows in the figure.

A Z-axis magnetic sensor 1, including a magnetoresistive element, according to the present embodiment may be configured as, for example, a geomagnetic sensor mounted in a mobile apparatus, such as a cellular phone.

The X-axis and Y-axis illustrated in each figure show two orthogonal directions in a horizontal plane parallel with a plane formed by a substrate 2, and the Z-axis shows a direction orthogonal to the horizontal plane.

Referring to FIGS. 3A and 3B, the Z-axis magnetic sensor 1 may include a first magnetoresistive element S1 to a fourth magnetoresistive element S4 and a soft magnetic member 3 formed on the substrate 2 made of silicon or the like. An insulating layer 4 may be formed between the soft magnetic member 3 and the first magnetoresistive element S1 to the fourth magnetoresistive element S4. The soft magnetic member 3 may be arranged in such a manner as to be spaced apart from the first magnetoresistive element S1 to the fourth magnetoresistive element S4 in a direction (height direction: Z1-Z2) perpendicular to the substrate 2.

Referring to FIG. 1, the first magnetoresistive element S1, the second magnetoresistive element S2, the third magnetoresistive element S3, and the fourth magnetoresistive element S4 each may be provided in a plurality and are arranged regularly on the substrate 2.

Referring to FIG. 1, the magnetoresistive elements S1 to S4 have a sensitivity axis direction P which may be, for example, the Y2 direction. The sensitivity axis direction P may be the Y1 direction.

Referring to FIG. 1, the soft magnetic member 3 may be formed in the shape of a lattice that may be formed in such a manner that a plurality of first soft magnetic portions 3a that extend in the X1-X2 direction and are arranged in the Y1-Y2 direction in such a manner as to be spaced apart from one another are combined together with a plurality of second soft magnetic portions 3b that extend in the Y1-Y2 direction and are arranged in the X1-X2 direction in such a manner as to be spaced apart from one another, at the intersections of the first soft magnetic portions 3a and the second soft magnetic portions 3b. The soft magnetic member 3 may be formed using a sputtering method, an evaporation method, a plating method, or the like. The length of the first soft magnetic portions 3a in the X1-X2 direction may be larger than the width of the first soft magnetic portions 3a in the Y1-Y2 direction. The length of the second soft magnetic portions 3b in the Y1-Y2 direction may be larger than the width of the first soft magnetic portions 3a in the X1-X2 direction. The portions at which the first soft magnetic portions 3a and the second soft magnetic portions 3b intersect can be defined as regions of both the first soft magnetic portions 3a and the second soft magnetic portions 3b.

Referring to FIG. 1, the magnetoresistive elements S1 to magnetoresistive elements S4 may be arranged in such a manner as to be spaced apart from one another in the Y1-Y2 direction and in such a manner as to extend in the X1-X2 direction. Here, the plurality of the first magnetoresistive elements S1 and the plurality of the fourth magnetoresistive elements S4 may be arranged on the Y1 side portions 3c side of the first soft magnetic portions 3a in plan view (when viewed from a direction perpendicular to the substrate 2), and the plurality of the second magnetoresistive elements S2 and the plurality of the third magnetoresistive elements S3 may be arranged on the Y2 side portions 3d side of the first soft magnetic portions 3a in plan view.

The magnetoresistive elements S1 to S4 may be formed in such a manner that the length thereof in the X1-X2 direction is larger than the width thereof in the Y1-Y2 direction. Further, the length of the magnetoresistive elements S1 to S4 in the X1-X2 direction may be made to have a value such that the magnetoresistive elements S1 to S4 protrude beyond both sides of the portions where the magnetoresistive elements S1 to S4 intersect with the second soft magnetic portions 3b, whereby the magnetoresistive elements S1 to S4 can receive a horizontal magnetic field component described later from the first soft magnetic portions 3a.

Referring to FIGS. 3A and 3B, the first magnetoresistive elements S1 and the fourth magnetoresistive elements S4 may be formed such that they entirely or partially protrude outward from the Y1 side portions 3c of the first soft magnetic portions 3a. Similarly, the second magnetoresistive elements S2 and the third magnetoresistive elements S3 may be formed such that they entirely or partially protrude outward from the Y2 side portions 3d of the first soft magnetic portions 3a. Also, the first magnetoresistive element S1 and the fourth magnetoresistive element S4, which may be formed on the Y1 side portions 3c side of the first soft magnetic portions 3a, can also be configured such that the first magnetoresistive element S1 and the fourth magnetoresistive element S4 are entirely arranged under the first soft magnetic portions 3a. Similarly, the second magnetoresistive elements S2 and the third magnetoresistive elements S3, which may be formed on the Y2 side portions 3d side of the first soft magnetic portions 3a, can also be configured such that the second magnetoresistive elements S2 and the third magnetoresistive elements S3 are entirely arranged under the first soft magnetic portions 3a.

Referring to FIG. 1, the end portions, in the X1-X2 direction, of the plurality of the first magnetoresistive elements S1 may be electrically connected to one another by conductive layers 16 so as to form a meandering shape. This is also true with the plurality of the second magnetoresistive elements S2, the plurality of the third magnetoresistive elements S3, and the plurality of the fourth magnetoresistive elements S4.

Referring to FIG. 1, the X2 side portion of the first magnetoresistive element S1 located furthest in the direction Y1 and the X1 side portion of the third magnetoresistive element S3 located furthest in the Y1 direction are connected to an input terminal Vdd through a connection wiring layer 17. The X2 side portion of the second magnetoresistive element S2 located furthest in the Y2 direction and the X1 side portion of the fourth magnetoresistive element S4 located furthest in the Y2 direction are connected to a ground terminal GND through a connection wiring layer 17. The X1 side portion of the first magnetoresistive element S1 located furthest in the Y2 direction among the plurality of the first magnetoresistive elements S1 and the X1 side portion of the second magnetoresistive element S2 located furthest in the Y1 direction among the plurality of the first magnetoresistive elements S2 may be connected to a first output terminal V1 through a connection wiring layer 17. The X2 side portion of the third magnetoresistive element S3 located furthest in the Y2 direction among the plurality of the third magnetoresistive elements S3 and the X2 side portion of the fourth magnetoresistive element S4 located furthest in the Y1 direction among the plurality of the fourth magnetoresistive elements S4 are connected to a second output terminal V2 through a connection wiring layer 17. As a result, a bridge circuit including the first magnetoresistive elements S1, the second magnetoresistive elements S2, the third magnetoresistive elements S3, and the fourth magnetoresistive elements S4 may be formed.

Referring to FIGS. 3A and 3B, a vertical magnetic field component H1 may be concentrated in the soft magnetic member 3 and may penetrate into the inside of the soft magnetic member 3 from a top surface 3e. The vertical magnetic field component H1 may pass through the soft magnetic member 3 and may be converted into a horizontal magnetic field component H2 in the Y1 direction and a horizontal magnetic field component H3 in the Y2 direction when the vertical magnetic field component H1 is output externally from the vicinity of the end portions of a bottom surface 3f. The directions of the horizontal magnetic field components H2 and H3 may be along the interfaces of the layers of the magnetoresistive elements S1 to S4, and the electric resistance values of the magnetoresistive elements S1 to S4 may vary due to the action of the horizontal magnetic field components H2 and H3.

Referring to FIGS. 3A and 3B, the horizontal magnetic field component H2 in the Y1 direction that is opposite to the sensitivity axis direction P may be input to the first magnetoresistive element S1 and the fourth magnetoresistive element S4, whereby the electric resistance values of the first magnetoresistive element S1 and the fourth magnetoresistive element S4 may be increased. On the other hand, referring to FIGS. 3A and 3B, the horizontal magnetic field component H3 in the Y2 direction that is the same as the sensitivity axis direction P may be input to the second magnetoresistive element S2 and the third magnetoresistive element S3, whereby the electric resistance values of the second magnetoresistive element S2 and the third magnetoresistive element S3 may be decreased. When the vertical magnetic field component H1 is input, an output is obtained from the bridge circuit including the magnetoresistive elements S1 to S4, whereby a vertical magnetic field component can be detected.

Referring to FIG. 4, the multilayer structure of the magnetoresistive element is described. Note that although FIG. 4 illustrates the multilayer structure of the magnetoresistive element S1, the magnetoresistive elements S2 to S4 have the same multilayer structure.

Referring to FIG. 4, the first magnetoresistive element S1 may be formed by stacking, for example, a non-magnetic base layer 60, a fixed magnetic layer 61, a non-magnetic layer 62, a free magnetic layer 63, and a protection layer 64 in this order from the bottom. The layers that form the magnetoresistive element S1 may be formed by, for example, sputtering.

In the embodiment illustrated in FIG. 4, the fixed magnetic layer 61 may have a multilayer ferri-structure including a first magnetic layer 61a, a second magnetic layer 61b, and a non-magnetic middle layer 61c that exists between the first magnetic layer 61a and the second magnetic layer 61b. The magnetic layers 61a and 61b may be formed of a soft magnetic material such as a CoFe alloy. The non-magnetic middle layer 61c may be formed of Ru, for example. The non-magnetic layer 62 may be formed of a non-magnetic material such as Cu. The free magnetic layer 63 may be formed of a soft magnetic material such as a NiFe alloy. The protection layer 64 may be formed of Ta, for example.

In the present embodiment, the fixed magnetic layer 61 may have a multilayer ferri-structure and may be of a self-pinned type in which the first magnetic layer 61a and the second magnetic layer 61b have fixed magnetization directions which are antiparallel to each other. In the self-pinned type structure illustrated in FIG. 4, an antiferromagnetic layer may not be used and, hence, the magnetization of each of the magnetic layers 61a and 61b that form the fixed magnetic layer 61 may be fixed without heat treatment in a magnetic field. Note that it is sufficient to make the magnetization intensities of the magnetic layers 61a and 61b be strong enough that magnetization fluctuations are not generated when an external magnetic force is applied.

However, the multilayer structure of the magnetoresistive element illustrated in FIG. 4 is only an example. For example, a multilayer structure may be used in which an antiferromagnetic layer, a fixed magnetic layer, a non-magnetic layer, a free magnetic layer, and a protection layer are stacked in this order from the bottom. In such a configuration, an exchange coupling magnetic field (Hex) can be generated between the antiferromagnetic layer and the fixed magnetic layer, thereby fixing the magnetization direction of the fixed magnetic layer. Also, a multilayer structure may be used in which the free magnetic layer 63, the non-magnetic layer 62, the fixed magnetic layer 61, and the protection layer 64 may be stacked in this order from the bottom. Further, the fixed magnetic layer 61 may have a structure in which the first magnetic layer 61a and the second magnetic layer 61b have the same magnetization intensity and antiparallel magnetization directions.

The fixed magnetization direction (P: sensitivity axis direction) of the second magnetic layer 61b that forms the magnetoresistive element is the Y2 direction (refer to FIG. 1 and FIG. 4). This fixed magnetization direction (P) is the fixed magnetization direction of the fixed magnetic layer 61.

Referring to FIG. 1, FIG. 2, and FIG. 4, a plurality of electrode layers 18 may be arranged on the top surfaces of the magnetoresistive elements S1 to S4 in such a manner as to be spaced apart from one another in the X1-X2 direction. Note that although FIG. 2 is a perspective view of portions of the magnetoresistive elements S1 and S2, the fourth magnetoresistive element S4 is illustrated by a perspective view similar to that of the first magnetoresistive element S1 illustrated in FIG. 2, and the third magnetoresistive element S3 is illustrated by a perspective view similar to that of the second magnetoresistive element S2 illustrated in FIG. 2.

Referring to FIG. 4, in locations in which the electrode layers 18 are formed, portions of the protection layer 64 may be removed, thereby forming depressions 64a, in which the electrode layers 18 are formed.

The electrode layers 18 may be formed of a non-magnetic conductive material that has a lower electric resistance value than a layer (protection layer 64 in FIG. 4) formed on surfaces at which the electrode layers 18 contact the magnetoresistive elements S1 to S4. The electrode layers 18 may be formed of a single layer or multiple layers made of a non-magnetic conductive material such as Al, Cu, Ti, or Cr, although not specifically limited to these. For example, the electrode layers 18 may be formed in such a manner as to have a multilayer structure consisting of Cu and Al layers. Note that the conductive layers 16 and the connection wiring layers 17 may be formed of a material similar to that of the electrode layers 18.

Referring to FIG. 1 and FIG. 2, the width (dimension in the Y1-Y2 direction) of the electrode layers 18 may be made to be larger than that of the magnetoresistive elements S1 to S4, whereby the electric resistance values of the electrode layers 18 can be reduced, and a margin allowed for positioning can be increased when forming the electrode layers 18 on the magnetoresistive elements S1 to S4.

Note that the removal of portions of the protection layer 64 described above may be performed by etching, for example. Processing for removing portions of the protection layer 64 is, in particular, for removing an oxidized layer of the surface of the protection layer 64. This enables good conductivity between the magnetoresistive elements S1 to S4 and the electrode layers 18.

When the surface of the protection layer 64 is removed by etching, for example, there may be control such that part of the protection layer 64 is left, as illustrated in FIG. 4. This prevents the free magnetic layer 63 from being influenced by the etching and, hence, from being removed.

Referring to FIG. 1, FIG. 2, and FIG. 4, the electrode layers 18 may face the second soft magnetic portions 3b in the height direction with the insulating layer 4 therebetween. Part or the entirety of each of the electrode layers 18 may be in a state of facing the position of the intersection between the first soft magnetic portion 3a and the second soft magnetic portion 3b in the height direction, depending on the positions at which the magnetoresistive elements S1 to S4 are formed.

In the present embodiment, currents more readily flow through the electrode layers 18, which may have a low electric resistance value, than through the magnetoresistive elements S1 to S4, that is, currents bypass the magnetoresistive elements S1 to S4. Hence, at a position where the electrode layer 18 is formed, the sensitivity of the magnetoresistive element can be made to be zero. Portions of the magnetoresistive elements S1 to S4 that are not overlapped by the electrode layers 18 are made to function as magnetoresistive elements.

Referring to FIG. 3, the Z-axis magnetic sensor 1 according to the present embodiment may be a sensor that detects the vertical magnetic field component H1 that is input from the outside in the height direction (Z). The vertical magnetic field component H1 may be, for example, the earth's magnetic field and has a very small magnitude as a magnetic field.

On the other hand, in a cellular phone or the like into which the Z-axis magnetic sensor 1 is integrated, a magnetic field with a comparatively large magnitude may be generated by a loud speaker and enters the Z-axis magnetic sensor 1 as a disturbance magnetic field.

In the present embodiment, shielding against a disturbance magnetic field can be appropriately provided by the soft magnetic member 3 that is formed in the shape of a lattice.

Referring to FIG. 1 and FIG. 2, when a disturbance magnetic field H4 enters the Z-axis magnetic sensor 1 from the X1-X2 direction, the disturbance magnetic field H4 more readily passes through the plurality of the first soft magnetic portions 3a that extend in the X1-X2 direction and are arranged in such a manner as to be spaced apart from one another in the Y1-Y2 direction and, hence, the effect of shielding the magnetoresistive elements S1 to S4 against the disturbance magnetic field H4 can be increased.

Similarly, referring to FIG. 1 and FIG. 2, when a disturbance magnetic field H5 enters the Z-axis magnetic sensor 1 from the Y1-Y2 direction perpendicular to the X1-X2 direction, the disturbance magnetic field H5 more readily passes through the plurality of the second soft magnetic portions 3b that extend in the Y1-Y2 direction and are arranged in such a manner as to be spaced apart from one another in the X1-X2 direction and, hence, the effect of shielding the magnetoresistive elements S1 to S4 against the disturbance magnetic field H5 can be increased.

In particular, since the Y1-Y2 direction is the same as the sensitivity axis direction P of the magnetoresistive elements S1 to S4, if the disturbance magnetic field H5 acts on the magnetoresistive elements S1 to S4 without the magnetoresistive elements S1 to S4 being shielded against the disturbance magnetic field H5, and if, at this time, the vertical magnetic field component H1 may be converted into the horizontal magnetic field components H2 and H3 and the horizontal magnetic field components H2 and H3 enter the magnetoresistive elements S1 to S4, the disturbance magnetic field H5 is superimposed on the horizontal magnetic field components H2 and H3. As a result, there arises a problem in that the sensitivity of the magnetoresistive elements S1 to S4 is changed between the case where the vertical magnetic field component is detected in a state in which the disturbance magnetic field H5 acts (state with an offset magnetic field) and the case where the vertical magnetic field component is detected in a state in which the disturbance magnetic field H5 does not act (state without an offset magnetic field), whereby the earth's magnetic field cannot be detected with high accuracy.

On the other hand, in the present embodiment, since the second soft magnetic portions 3b that extend in the Y1-Y2 direction that is the same as the sensitivity axis direction P may be formed in such a manner as to be combined together with the first soft magnetic portions 3a that extend in the X1-X2 direction, shielding against the disturbance magnetic field H5 can be appropriately provided by the second soft magnetic portions 3b, and a change in the sensitivity of the magnetoresistive elements S1 to S4 between the case in which the disturbance magnetic field H5 exists and the case in which the disturbance magnetic field H5 does not exist can be reduced, whereby the earth's magnetic field can be detected with high accuracy.

Figure 5:
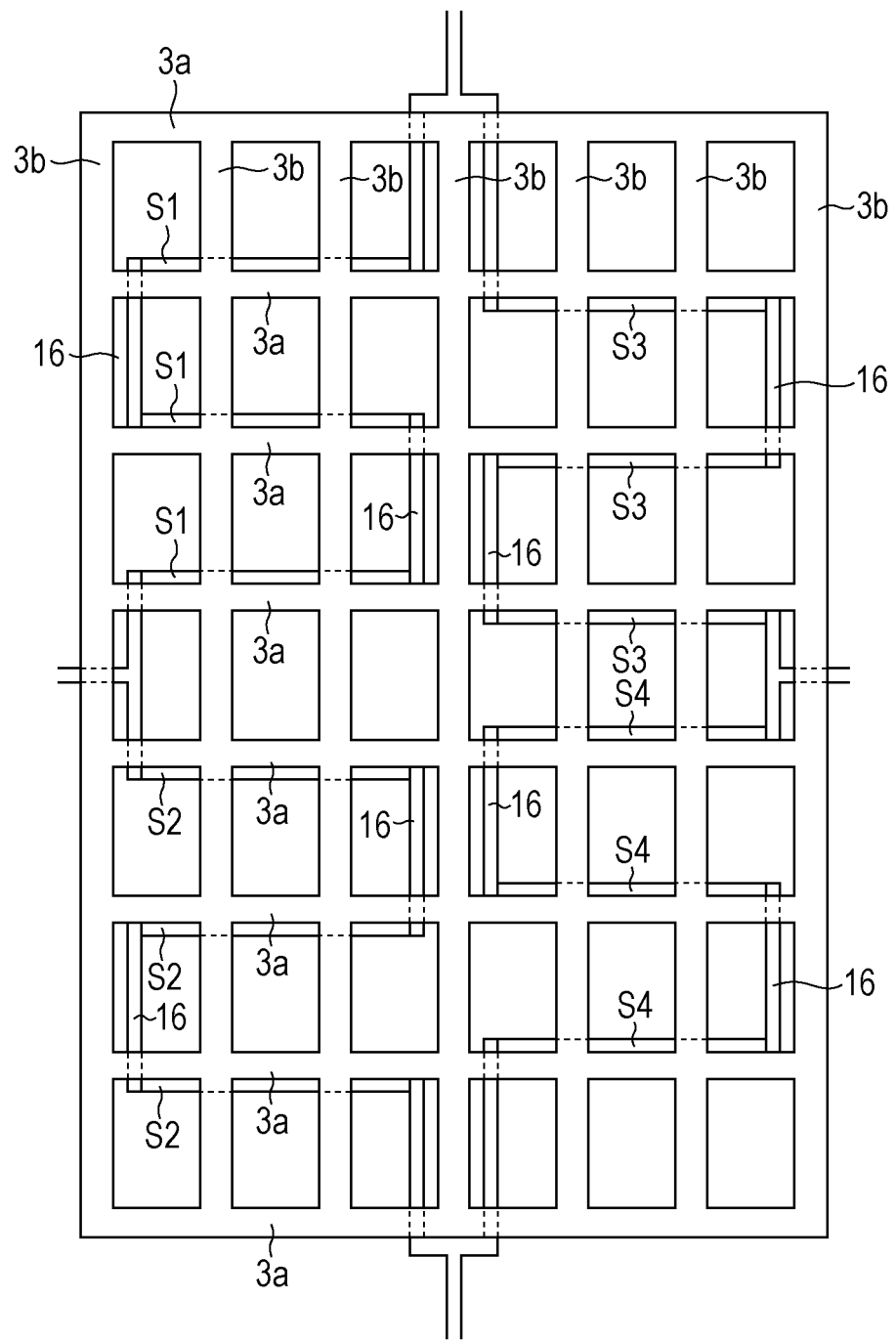
FIG. 5 is a plan view of a Z-axis magnetic sensor according to an exemplary embodiment.

Referring to FIG. 5, in the present embodiment, a configuration may be employed in which, for the magnetoresistive elements S1 to S4 formed in such a manner as to extend in the X1-X2 direction, the electrode layers 18 are not formed in locations that face the second soft magnetic portions 3b in the height direction. However, the electrode layers 18 may be provided in locations that face the second soft magnetic portions 3b in the height direction for the magnetoresistive elements S1 to S4, as illustrated in FIG. 1, FIG. 2, and FIG. 4. This can make the magnetoresistive elements not function as magnetoresistive elements in the locations of the electrode layers 18. As a result, even when a disturbance magnetic field component leaks into the magnetoresistive elements S1 to S4 in a state in which the disturbance magnetic field H5 having a very strong magnitude is input from the Y1-Y2 direction and, for example, the second soft magnetic portions 3b are magnetically saturated at this time, the disturbance magnetic field component is likely to leak into portions that do not function as magnetoresistive elements. Hence, a change in the sensitivity of the magnetoresistive elements S1 to S4 between the case in which the disturbance magnetic field H5 exists and the case in which the disturbance magnetic field H5 does not exist can be effectively reduced irrespective of the magnitude of the disturbance magnetic field H5.

In the present embodiment, the shape anisotropy effect can be sufficiently obtained as a result of the magnetoresistive elements S1 to S4 being formed in such a manner as to be longer in the X1-X2 direction. This allows the free magnetic layer 63 to have anisotropy facing in the X1-X2 direction when there is no magnetic field. Further, in the present embodiment, a bias layer is not provided for the magnetoresistive elements S1 to S4, and the magnetoresistive elements S1 to S4 have a non-bias structure. In the present embodiment, a configuration may be employed in which the magnetoresistive elements S1 to S4 include a bias layer (permanent magnetic layer), and a bias magnetic field is applied to the free magnetic layer 63, whereby the magnetization direction is directed to the X1-X2 direction. However, in the configuration including a bias layer, when a strong magnetic field is input, the magnetization direction of the bias layer will follow the direction of the magnetic field and, hence, a variation in sensitivity and a decrease in detection accuracy are likely to be generated. In the present embodiment, shielding against the disturbance magnetic fields H4 and H5 is provided by the soft magnetic member 3, and by using the magnetoresistive elements S1 to S4 having a non-bias structure and shape anisotropy for reducing the influence of, for example, a leakage magnetic field from the soft magnetic member 3, high resistance to a disturbance magnetic field is obtained and hysteresis and linearity can be effectively improved.

In FIG. 1, a bridge circuit may be formed of the first magnetoresistive elements S1, the second magnetoresistive elements S2, the third magnetoresistive elements S3, and the fourth magnetoresistive elements S4. However, a configuration may be employed in which the third magnetoresistive elements S3 and the fourth magnetoresistive elements S4 are not provided (may be replaced by resistors, for example) and the first magnetoresistive elements S1 and the second magnetoresistive elements S2 are provided.

Figure 6:
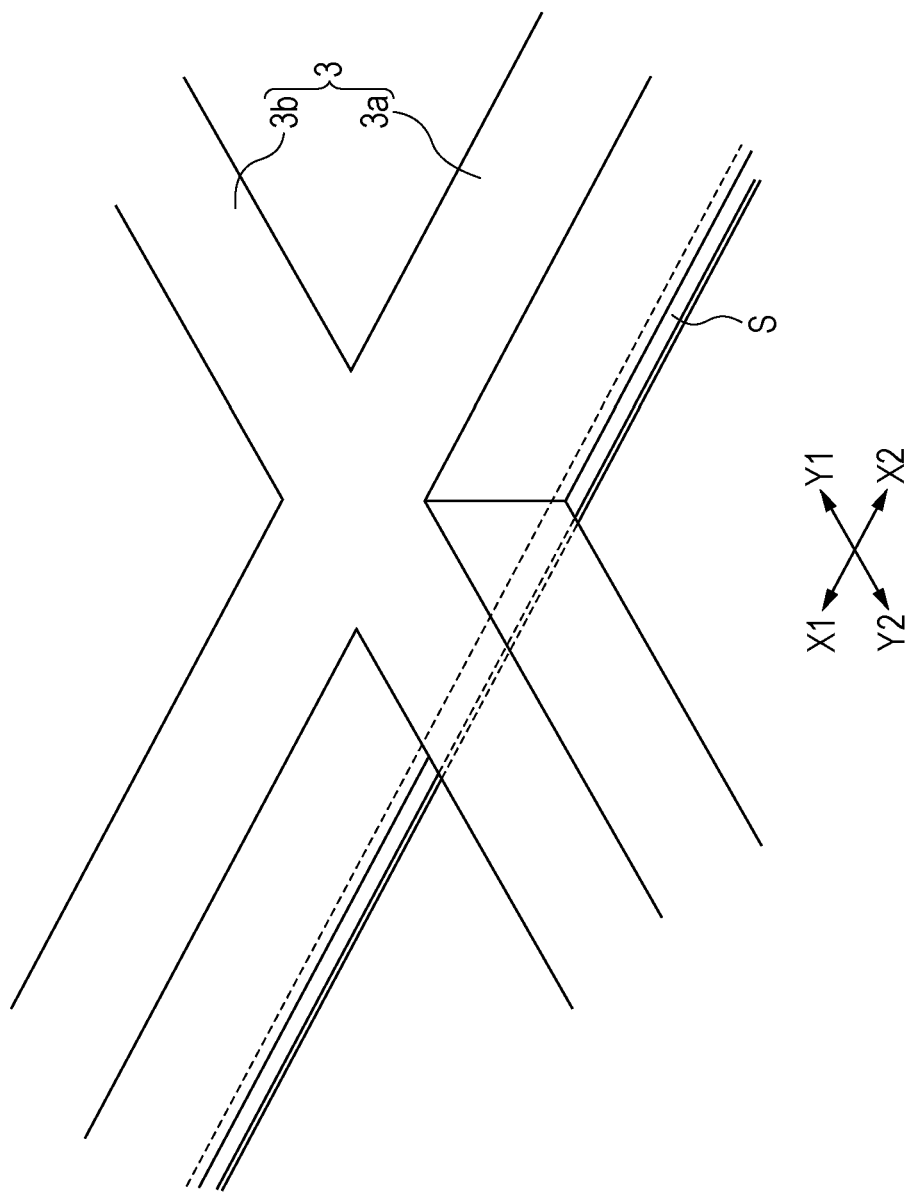
FIG. 6 is a partial perspective view of a Z-axis magnetic sensor according to an exemplary embodiment.

The configuration illustrated in FIG. 6 shows a minimum unit of the magnetic sensor in the present embodiment. In other words, FIG. 6 illustrates a configuration in which the single first soft magnetic portion 3a and the single second soft magnetic portion 3b may be provided in such a manner as to intersect with each other, and a single magnetoresistive element S is arranged in a location which is below the first soft magnetic portion 3a and in which, when a vertical magnetic field component is input, a horizontal magnetic field component in the Y1-Y2 direction can be received from the first soft magnetic portion 3a. Also in the configuration illustrated in FIG. 6, by providing the second soft magnetic portions 3b, shielding against disturbance magnetic fields in the X1-X2 direction and the Y1-Y2 direction can be effectively provided by the soft magnetic member 3 and detection accuracy in the vertical magnetic field component can be increased, compared with a configuration without the second soft magnetic portions 3b.

Example

Figure 7:
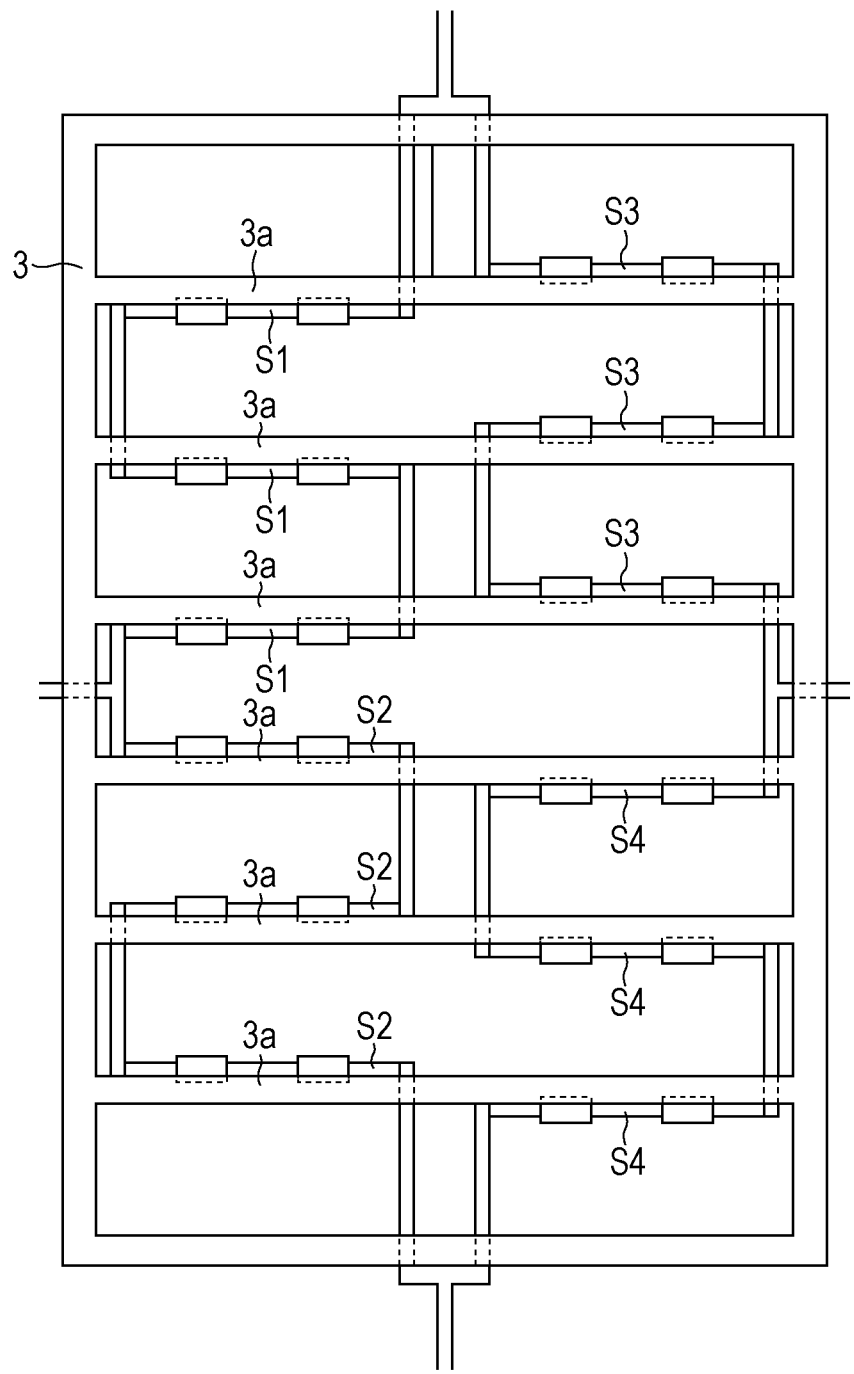
FIG. 7 is a plan view of a Z-axis magnetic sensor according to a comparative example.

In an experiment, the magnetic sensor of the embodiment illustrated in FIG. 1 and a comparative example illustrated in FIG. 7 were used.

In the comparative example illustrated in FIG. 7, unlike FIG. 1, the second soft magnetic portions 3b that extend in the Y1-Y2 direction are not provided in the soft magnetic member 3 (except for soft magnetic members that extend in the Y1-Y2 direction and are arranged on both sides in the X1-X2 direction). The rest of the configuration is the same as that of FIG. 1.

Note that the sensitivity axis direction of all of the magnetoresistive elements that form the magnetic sensor is the Y2 direction.

In the experiment, a vertical magnetic field of −6 Oe to +6 Oe in the Z direction (height direction) was applied to the magnetic sensors of the embodiment and the comparative example, and the sensitivity (without application of an offset magnetic field) was calculated. Note that "−6 Oe" refers to a vertical magnetic field of 6 Oe applied in the Z1 direction illustrated in FIG. 3, and "+6 Oe" refers to a vertical magnetic field of 6 Oe applied in the Z2 direction illustrated in FIG. 3. The hysteresis loop was measured by changing the magnitude of a vertical magnetic field from −6 Oe to +6 Oe. The amount of change in MR (amount of change in resistance per unit magnetic field) obtained at this time is termed the "sensitivity".

Figure 8A:
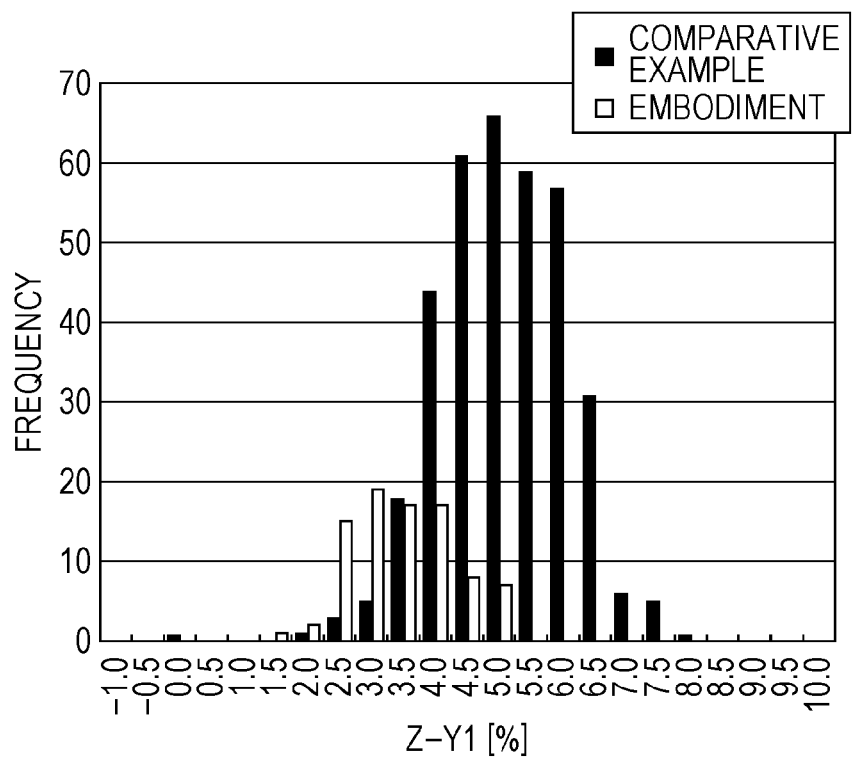
FIG. 8A and FIG. 8B are graphs illustrating an offset magnetic field sensitivity change in an embodiment and the comparative example.

Then, the sensitivity was calculated by applying a vertical magnetic field of −6 Oe to +6 Oe in the Z direction (height direction) while an offset magnetic field (disturbance magnetic field) of 5 Oe in the Y1-Y2 direction was continuously applied. FIG. 8A illustrates the results of the experiment in the case where the offset magnetic field in the Y1 direction was applied, and FIG. 8B illustrates the results of the experiment in the case where the offset magnetic field in the Y2 direction was applied.

Figure 8B:
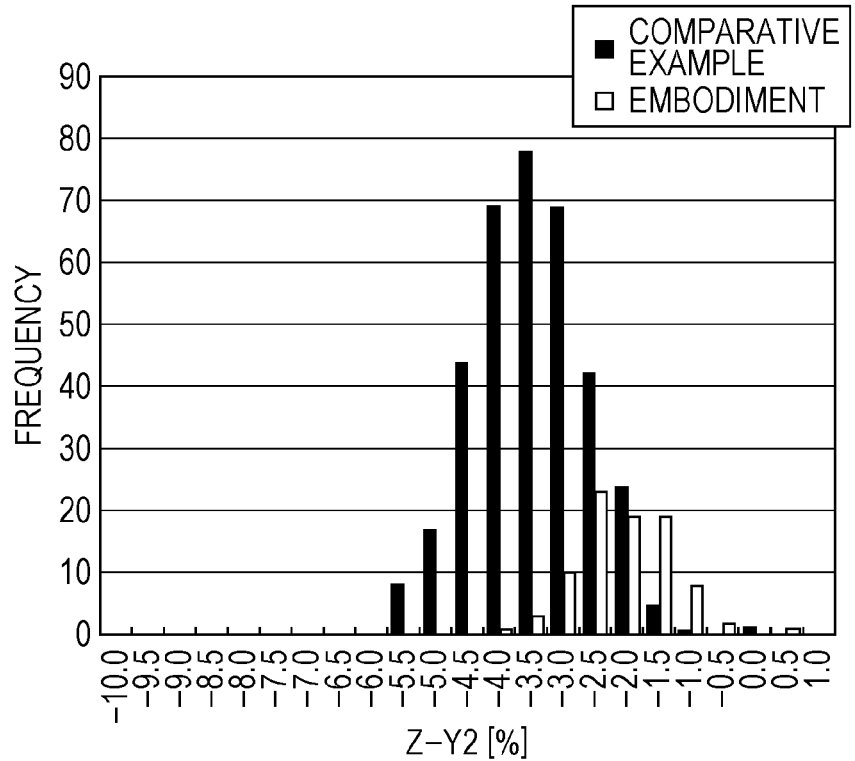

The horizontal axis illustrated in FIGS. 8A and 8B represents the change in sensitivity (%) between the case in which the offset magnet field exists and the case in which the offset magnetic field does not exist, and the change in sensitivity is given by [(sensitivity (with application of an offset magnetic field)/(sensitivity (without application of an offset magnetic field)−1)×100(%)]. The vertical axis represents frequency.

Referring to FIG. 8A, the peak change in sensitivity for the comparative example was about 5%, but the peak change in sensitivity for the embodiment was reduced to about 3%. Referring to FIG. 8B, the peak change in sensitivity for the comparative example was −3.5%, but the peak change in sensitivity for the embodiment was reduced to about −2 to −2.5% (comparison of absolute values).

In this manner, it was determined that a change in sensitivity can be reduced in the embodiment compared with the comparative example.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. A magnetic sensor, comprising:
   a magnetoresistive element that is formed by stacking a magnetic layer and a non-magnetic layer on a substrate and that exhibits a magnetoresistive effect; and
   a soft magnetic member that converts a vertical magnetic field component input from the outside from a direction perpendicular to the substrate into a horizontal magnetic field component in a direction along the substrate and that provides the horizontal magnetic field component to the magnetoresistive element,
   wherein the soft magnetic member is arranged with a space in a height direction between the soft magnetic member and the magnetoresistive element,
   wherein the magnetoresistive element is formed in such a manner as to extend in an X1-X2 direction and has a sensitivity axis in a Y1-Y2 direction, the X1-X2 direction and the Y1-Y2 direction being orthogonal to each other in a plane along the substrate,
   wherein the soft magnetic member is formed of a first soft magnetic portion extending in the X1-X2 direction and a second soft magnetic portion extending in the Y1-Y2 direction combined together, and
   wherein the magnetoresistive element is arranged in a location in which the magnetoresistive element is capable of receiving the horizontal magnetic field component in the Y1-Y2 direction from the first soft magnetic portion.

2. The magnetic sensor according to claim 1, wherein the magnetoresistive element includes a current bypass electrode layer arranged thereon in a location facing, in the height direction, the second soft magnetic portion or in a location facing, in the height direction, an intersection portion of the first soft magnetic portion and the second soft magnetic portion.

3. The magnetic sensor according to claim 1,
   wherein the first soft magnetic portion is one of a plurality of first soft magnetic portions extending in the X1-X2 direction and spaced apart from one another in the Y1-Y2 direction,
   wherein the second soft magnetic portion is one of a plurality of second soft magnetic portions extending in the Y1-Y2 direction and spaced apart from one another in the X1-X2 direction,
   wherein the soft magnetic member is formed of the plurality of the first soft magnetic portions and the plurality of the second soft magnetic portions, combined together, and
   wherein the magnetoresistive element includes a first magnetoresistive element that is located on a Y1 side portion side of the first soft magnetic portion and receives the horizontal magnetic field component in the Y1 direction and a second magnetoresistive element that is located on a Y2 side portion side of the first soft magnetic portion and receives the horizontal magnetic field component in the Y2 direction, when viewed in plan from the vertical direction.

4. The magnetic sensor according to claim 3, wherein the first magnetoresistive element, the second magnetoresistive element, a third magnetoresistive element having the same configuration as the second magnetoresistive element, and a fourth magnetoresistive element having the same configuration as the first magnetoresistive element are provided, thereby forming a bridge circuit.

* * * * *